United States Patent
Lee et al.

(10) Patent No.: US 9,076,865 B2
(45) Date of Patent: Jul. 7, 2015

(54) NON-VOLATILE MEMORY DEVICE, METHOD OF OPERATING THE SAME AND METHOD OF FABRICATING THE SAME

(71) Applicant: SK hynix Inc., Icheon-si Gyeonggi-do (KR)

(72) Inventors: Jun Hyuk Lee, Seoul (KR); Seul Ki Oh, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 297 days.

(21) Appl. No.: 13/716,943

(22) Filed: Dec. 17, 2012

(65) Prior Publication Data

US 2014/0056080 A1 Feb. 27, 2014

(30) Foreign Application Priority Data

Aug. 24, 2012 (KR) ........................ 10-2012-0093179

(51) Int. Cl.
 *G11C 16/04* (2006.01)
 *H01L 29/78* (2006.01)
 *H01L 27/115* (2006.01)
 *H01L 29/786* (2006.01)

(52) U.S. Cl.
 CPC ........ *H01L 29/7827* (2013.01); *G11C 16/0408* (2013.01); *H01L 27/1157* (2013.01); *H01L 27/11582* (2013.01); *H01L 29/78642* (2013.01)

(58) Field of Classification Search
 USPC .............. 365/185.09, 185.29, 185.18, 185.17
 See application file for complete search history.

(56) References Cited

U.S. PATENT DOCUMENTS

| 7,932,551 | B2* | 4/2011 | Kim et al. | 257/314 |
| 8,045,383 | B2* | 10/2011 | Sel et al. | 365/185.17 |
| 8,198,157 | B2* | 6/2012 | Sel et al. | 438/257 |
| 8,625,351 | B2* | 1/2014 | Park | 365/185.17 |
| 8,675,409 | B2* | 3/2014 | Sel et al. | 365/185.17 |

FOREIGN PATENT DOCUMENTS

| KR | 101054554 B1 | 7/2011 |
| KR | 10-2011-0055531 A | 12/2012 |

OTHER PUBLICATIONS

Ryota Katsumata et al., "Pipe-shaped BiCS Flash Memory with 16 Stacked Layers and Multi-Level-Cell Operation for Ultra High Density Storage Devices," VLSI Technology, 2009 symposium, ISBN 978-4-86348-009-4, pp. 136-137, Japan.

* cited by examiner

*Primary Examiner* — Pho M Luu
(74) *Attorney, Agent, or Firm* — William Park & Associates Ltd.

(57) ABSTRACT

A non-volatile memory device includes a semiconductor substrate having active regions formed of a p-type semiconductor, first and second vertical strings disposed on the active regions, channels extending vertical to the semiconductor substrate, and a plurality of memory cells stacked along the channels, wherein the active regions are directly connected to the channels of the first and second vertical strings.

23 Claims, 12 Drawing Sheets

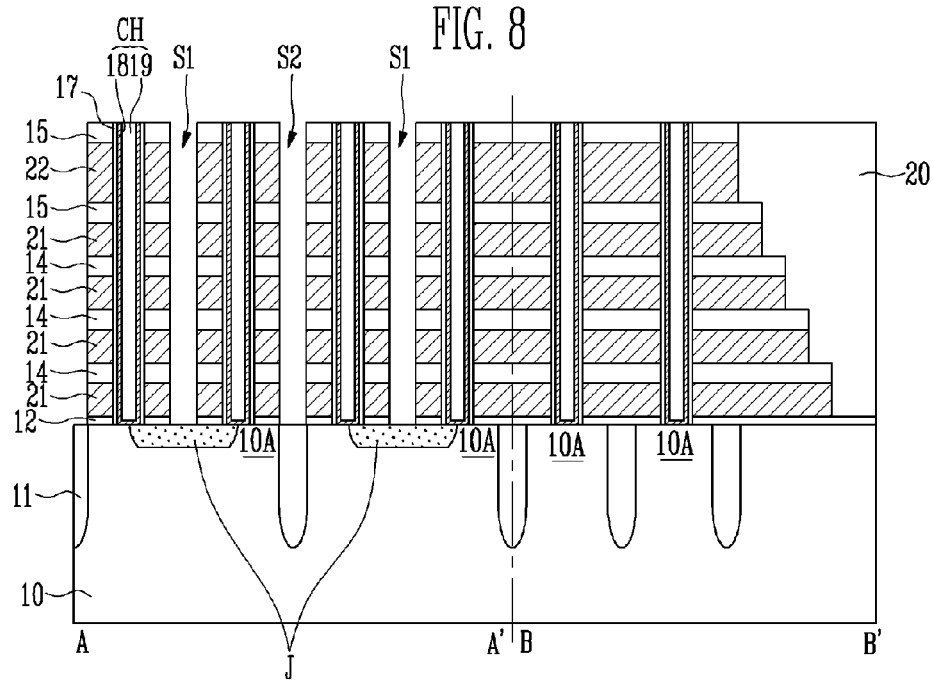
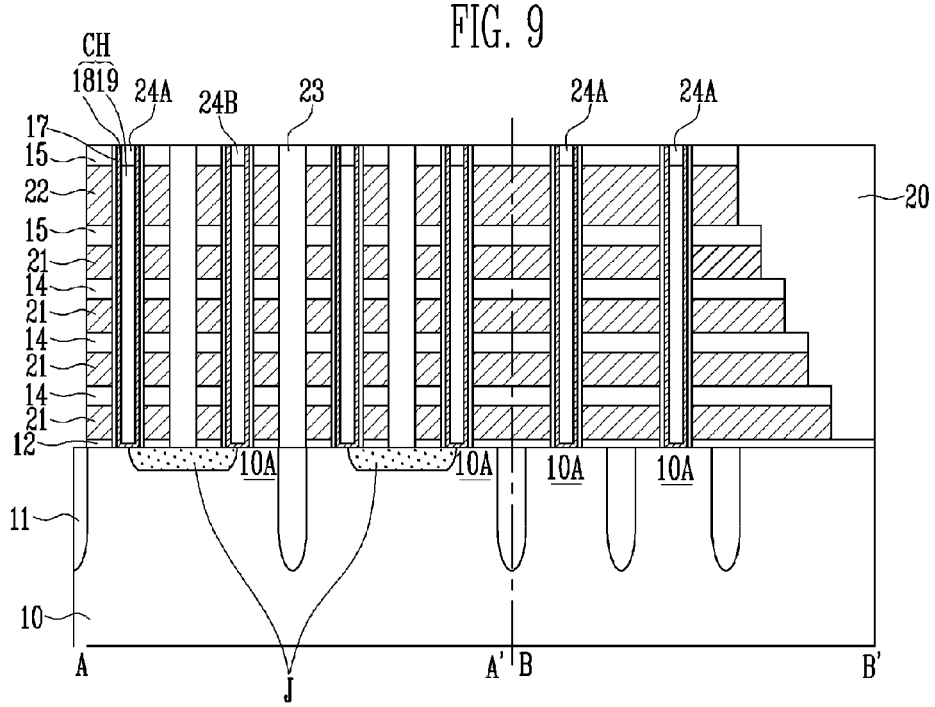

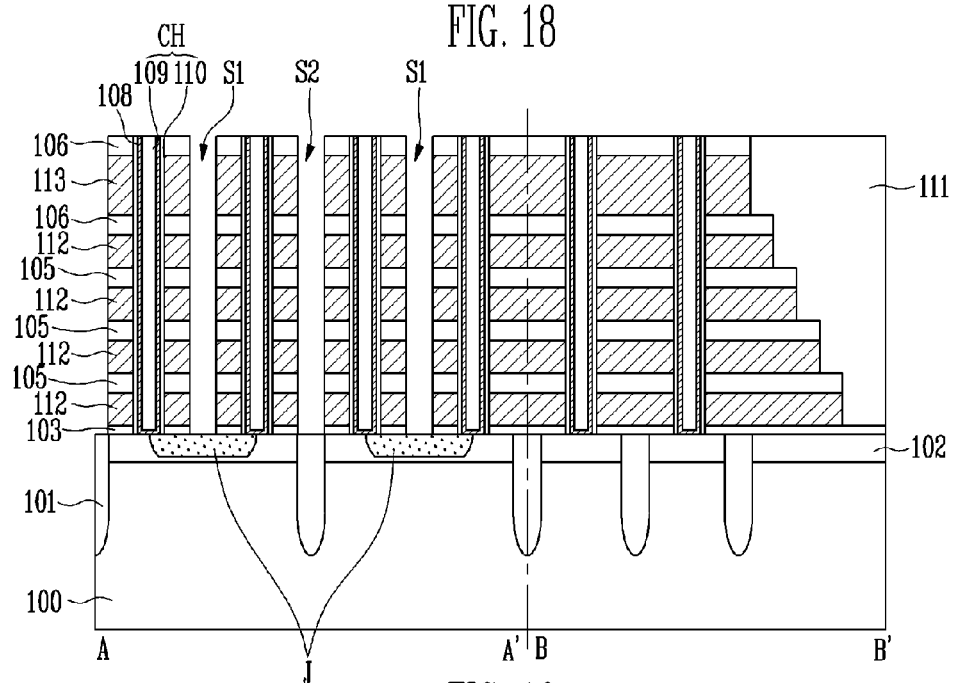
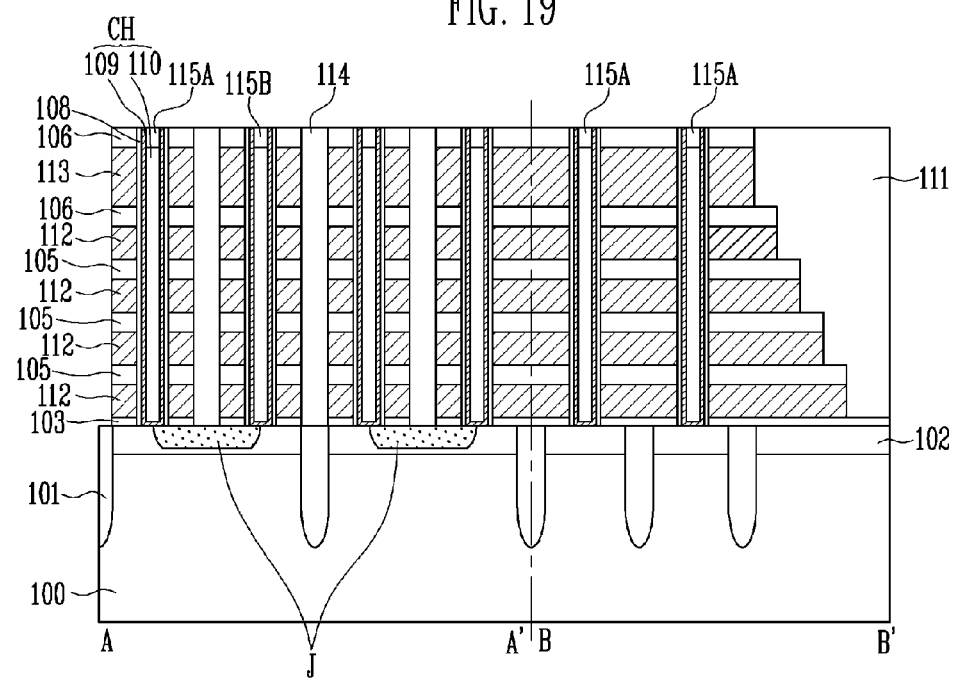

NON-VOLATILE MEMORY DEVICE, METHOD OF OPERATING THE SAME AND METHOD OF FABRICATING THE SAME

CROSS-REFERENCE TO RELATED APPLICATION

This application claims priority to and the benefit of Korean Patent Application No. 10-2012-0093179, filed on Aug. 24, 2012 the disclosure of which is incorporated herein by reference in its entirety.

BACKGROUND

The present invention relates generally to a non-volatile memory device and a method of operating and fabricating the same, and more specifically, to a non-volatile memory device including a plurality of memory cells vertically stacked on a substrate and a method of operating and fabricating the same.

DISCUSSION OF RELATED ART

A non-volatile memory device maintains data stored therein even when power is cut off. Currently, various non-volatile memory devices, e.g., a NAND flash memory, are being widely used.

Recently, as the improvement of integration intensity of a two-dimensional non-volatile memory device forming a single-layered memory cell on a silicon substrate has been limited, various manners of three-dimensional non-volatile memory devices in which a plurality of memory cells are vertically stacked on a silicon substrate have been suggested.

In a paper published on Jun. 16-18, 2009 entitled "Pipe-shaped BiCS Flash Memory with 16 Stacked Layers and Multi-Level-Cell Operation for Ultra High Density Storage Devices," VLSI Technology, 2009 symposium, ISBN 978-4-86348-009-4, pp. 136-137, a flash memory with a PBiCS structure is disclosed. Unlike the general three-dimensional non-volatile memory device in which bit lines and source lines are disposed on upper and lower parts of the stacked memory cell, respectively, both bit and source lines are disposed on a stacked memory cell in this structure. Therefore, since only a selected gate of one layer is required, this structure is superior in terms of integration intensity, and a metal source line may further be formed to reduce resistance.

However, because a channel is separated from a substrate body in the PBiCS structure, an erase operation by the F-N tunneling method in which a high voltage is applied to the substrate body to inject holes in a floating gate of a memory cell as in the conventional art may be impossible to perform. Instead, holes generated by applying a high voltage to the selected gate and generating a gate induced drain leakage (GIDL) current to be injected to a channel allow an erase operation to occur. However, the erase method performed using the generation of a GIDL current is not easy to control, and corresponding efficiency may decrease.

In a paper disclosed on the same date, entitled "Vertical Cell Array using TCAT (Terabit Cell Array Transistor) Technology for Ultra High Density NAND Flash Memory," VLSI Technology, 2009 symposium, ISBN 978-4-86348-009-4, pp. 192-193, a flash memory with a TCAT structure is disclosed. In this structure, a channel is in direct contact with a substrate body, allowing data to be erased in a conventional manner. Furthermore, word lines are formed by removing a sacrificial layer using a slit and filling tungsten therein, allowing resistance of the word line to be reduced.

However, in the TCAT structure, a source line is formed on a substrate using an ion implantation process via a narrow slit, thereby significantly increasing the resistance of the source line.

Therefore, implementation of a three-dimensional non-volatile memory device in a new structure capable of overcoming the above mentioned problems is required.

SUMMARY OF THE INVENTION

The present invention is directed to a non-volatile memory device in which memory cells may be vertically stacked to feature both an increased integration intensity and a simple and efficient way for an erase operation, and a method of fabricating the same.

An embodiment of the present invention provides a non-volatile memory device including a semiconductor substrate having active regions formed of a p-type semiconductor, first and second vertical strings disposed on the active regions, channels vertical to the semiconductor substrate, and a plurality of memory cells stacked along the channels, wherein the active regions are directly connected to the channels of the first and second vertical strings.

Another embodiment of the present invention provides a non-volatile memory device having a conductive layer for applying an erase voltage formed on a semiconductor substrate, first and second vertical strings formed on the conductive layer for applying an erase voltage, channels vertical to the semiconductor substrate, and a plurality of memory cells stacked along the channels, wherein the conductive layer for applying an erase voltage is directly connected to the channels of the first and second vertical strings.

Another embodiment of the present invention provides a method of operating a non-volatile memory device including providing a non-volatile memory device with having a semiconductor substrate with active regions formed of a p-type semiconductor, first and second vertical strings disposed on the active regions, channels vertical to the semiconductor substrate, a plurality of memory cells stacked along the channels, and ion implantation regions formed in the active regions, connecting the channels of the first and second vertical strings by the ion implantation regions during program and reading operations, and applying an erase voltage to the active regions during an erase operation by applying an erase voltage to the channels of the first and second vertical strings electrically connected to the active regions.

Another embodiment of the present invention provides a method of operating a non-volatile memory device, the method including providing a non-volatile memory device with having conductive layers for applying an erase voltage formed on a semiconductor substrate, first and second vertical strings disposed on the semiconductor substrate, including channels vertical to the semiconductor substrate, a plurality of memory cells stacked along the channels, and ion implantation regions formed in the conductive layers for applying an erase voltage, connecting the channels of the first and second vertical strings by the ion implantation regions during program and reading operations, and applying an erase voltage to the conductive layers for applying an erase voltage during an erase operation by applying the erase voltage to the channels of the first and second vertical strings electrically connected to the conductive layers.

Another embodiment of the present invention provides a method of fabricating a non-volatile memory device, comprising selectively etching a p-type semiconductor substrate to form trenches defining a plurality of active regions, forming an isolation layer filling the trenches, forming first and second vertical strings disposed on each of the active regions, and forming ion implantation regions in the active regions, wherein the first and second vertical strings result in being disposed at a boundary between the ion implantation regions and the active regions by performing an ion implantation process.

Another embodiment of the present invention provides a method of fabricating a non-volatile memory device, comprising forming conductive layers for applying an erase voltage on a semiconductor substrate, selectively etching the conductive layers for applying an erase voltage and the semiconductor substrate to form a trench, forming an isolation layer filling the trench, forming first and second vertical strings disposed on the conductive layers for applying an erase voltage, and forming ion implantation regions in the conductive layer for applying an erase voltage, wherein the first and second vertical strings result in being disposed at a boundary between the ion implantation regions and the conductive layers for applying an erase voltage.

BRIEF DESCRIPTION OF THE DRAWINGS

The above and other features and advantages of the present invention will become more apparent to those of ordinary skill in the art by describing in detail various embodiments thereof with reference to the attached drawings in which:

FIGS. 2 to 10 are cross-sectional views illustrating a method of fabricating a non-volatile memory device according to a an embodiment of the present invention;

FIGS. 12 to 20 are cross-sectional views illustrating a method of fabricating a non-volatile memory device according to another embodiment of the present invention.

DETAILED DESCRIPTION OF EMBODIMENTS

The present invention will be described more fully hereinafter with reference to the accompanying drawings, in which various embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Nevertheless, the specification and claims should be read with the understanding that such combinations are entirely within the scope of the invention and the claims.

Figure 1:
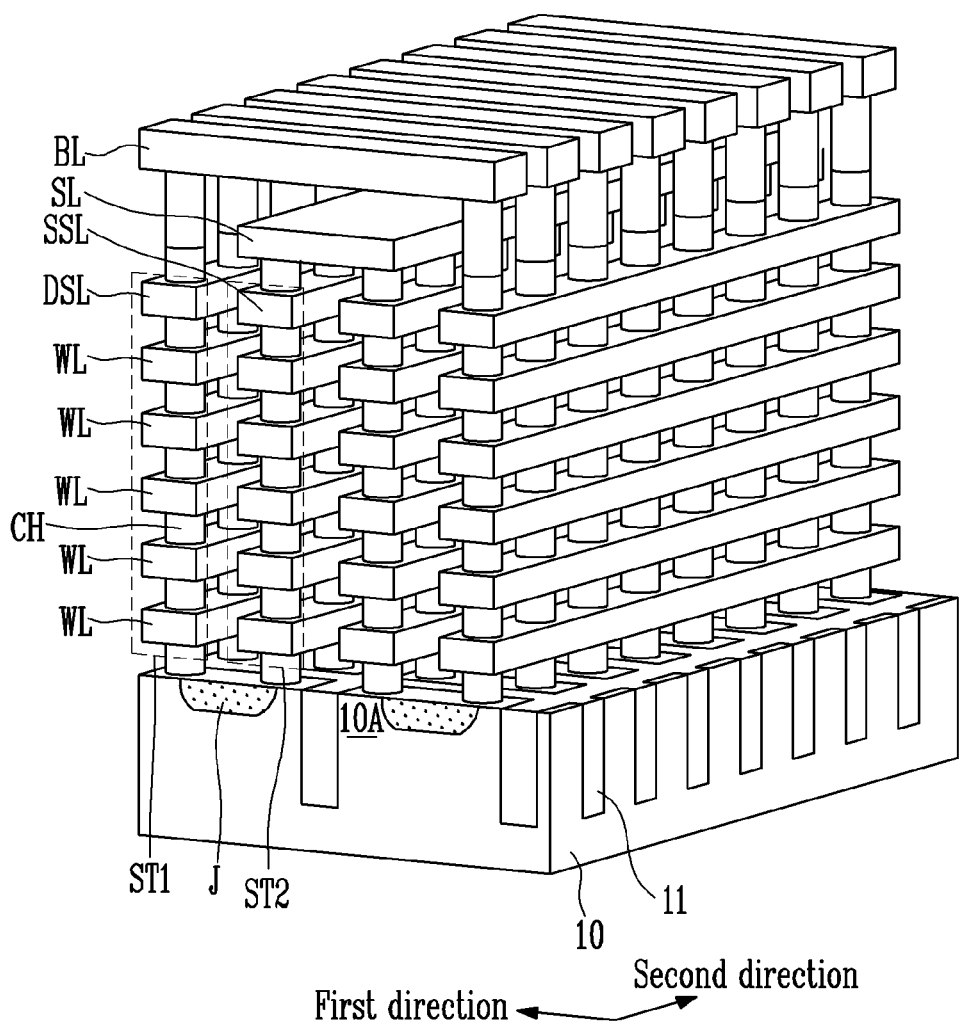
FIG. 1 is a perspective view of a non-volatile memory device according to a an embodiment of the present invention.

FIG. 1 is a perspective view of a non-volatile memory device according to an embodiment of the present invention.

Referring to FIG. 1, a non-volatile memory device according to an embodiment includes a semiconductor substrate 10 having a plurality of active regions 10A formed of a p-type semiconductor and defined by an isolation layer 11, and a pair of vertical strings ST1 and ST2 formed on each upper surface of the active regions 10A. The upper surface of the active region 10A includes an n-type ion implantation region J in contact with a portion of the pair of vertical strings ST1 and ST2, thereby electrically connecting the pair of vertical strings ST1 and ST2 to each other via the ion implantation region J. The pair of vertical strings ST1 and ST2 are formed at a boundary between the ion implantation region J and the active regions 10A. That is, the pair of vertical strings ST1 and ST2 are connected to both the ion implantation region J and the active regions 10A.

More specifically, the plurality of active regions 10A formed in the semiconductor substrate 100 are arranged in a matrix form along first and second directions. FIG. 1 depicts each of the active regions 10A formed in a bar-type planar shape manner having a long axis in the first direction and a short axis in the second direction. Also, the active regions 10A are separated from each other by the isolation layer 11 formed to a predetermined depth. Since the semiconductor substrate 10 consists of a p-type semiconductor, the active regions 10A consist of a p-type semiconductor as well. The ion implantation region J is disposed in a portion of the active regions 10A, and is formed as an n type.

The pair of vertical strings ST1 and ST2 are disposed on each of the active regions 10A. A vertical string of the pair of vertical strings ST1 and ST2 to be connected to the bit line BL is referred to as a first vertical string ST1, and the other vertical string to be connected to the source line SL is referred to as a second vertical string ST2 for clarity. A lower end of the first vertical string ST1 includes channels CH in contact with an upper part of the boundary between the active regions 10A and the ion implantation region J and projecting in a vertical direction, a plurality of word lines WL and a drain selection line DSL stacked along the channels CH, memory layers (not shown) interposed between the word lines WL and the channels CH, and gate insulating layers (not shown) interposed between the word lines WL and the channels CH. Similarly, a lower end of the second vertical string ST2 includes channels CH in contact with an upper part of the boundary between the active region 10A and the ion implantation region J and projecting in a vertical direction, a plurality of word lines WL and a source selection line SSL stacked along the channels CH, a memory layer (not shown) interposed between the word lines WL and the channels CH, and a gate insulating layer (not shown) interposed between the source selection line SSL and the channels CH.

The memory layer performs a function of insulating the channel CH from the word line WL and storing charges. The memory layer may include a tunnel insulating layer disposed close to the channels CH to enable tunneling of the charges, a charge blocking layer disposed close to the word lines WL to enable the tunneling of charges, and a charge storage layer interposed between the tunnel insulating layer and the charge blocking layer to store charges. The tunnel insulating layer and the charge blocking layer may be formed of an oxide layer, and the charge storage layer may be formed of a nitride layer having a function of trapping charges.

An interlayer insulating layer that is not shown is interposed between the word lines, between the word line WL and the drain selection line DSL, and between the word line WL and the source selection line SSL to provide insulation therebetween. The memory layer in contact with one channel CH and a word line WL constitutes a unit memory cell, the gate insulating layer in contact with one channel CH and the drain selection line DSL constitutes a drain selection transistor, and the gate insulating layer in contact with one channel CH and the source selection line SSL constitutes a source selection transistor. The word lines WL, the drain selection lines DSL, and the source selection lines SSL extend in the second direction and are in contact with the channels CH arranged in the second direction.

The bit lines BL are connected to the upper ends of the channels CH of the first vertical string ST1 and extend in the first direction. The source lines SL are connected to the upper ends of the channels CH of the second vertical string ST2 and extend in the second direction. The above-described drain selection transistor controls the connection between the bit lines BL and the first vertical strings ST1, and the source selection transistor controls the connection between the source lines SL and the second vertical strings ST2.

Although one block is depicted to include two U-shaped strings in the first direction in FIG. 1, the invention is not limited thereto, and the number of U-shaped strings included in one block may be variously modified.

A U-shaped second vertical string ST2 and another adjacent U-shaped second vertical string ST2 in the first direction may be disposed adjacent to each other, and may share the source line SL accordingly. The first vertical strings ST1 arranged in the first direction may share a bit line BL.

According to the non-volatile memory device according to the an embodiment of the present invention, the following effects may be obtained.

First, both the bit line BL and the source line SL are disposed on the first and second vertical strings ST1 and ST2 to enable the bit line BL and the source line SL to exhibit low resistance such as a metal in order to reduce line resistance. Further, since the drain selection transistor and the source selection transistor are formed on the same layer, the integration intensity in the vertical direction may be improved.

Moreover, the channels CH of the first and second vertical strings ST1 and ST2 are directly connected to the active regions 10A of the semiconductor substrate 10 formed of a p-type semiconductor. Therefore, a positive high voltage is applied to the semiconductor substrate 10 in order to perform an erase operation by injecting holes into the channel CH to obtain excellent erase efficiency.

Even if the channels CH of the first and second vertical strings ST1 and ST2 are directly connected to the active regions 10A, they may be directly connected to the ion implantation region J formed in the active regions 10A as well, thus directly connecting the first vertical string ST1 to the second vertical string ST2 by the n-type ion implantation region J during reading and program operations. Therefore, the operations are not influenced.

Thus, the non-volatile memory device according to an embodiment of the present invention may have advantageous effects compared to conventional PBiCS and TCAT structures, by applying a positive high voltage to the semiconductor substrate 10 to perform an erase operation in a manner of injecting holes into the channels CH. Further, the channels CH of the first and second vertical strings ST1 and ST2 inverted to an n type by the voltage applied to the word lines during the reading and program operations are connected to each other by the n-type ion implantation region J.

The detailed operation method will now be described.

The reading operation will first be described. First of all, a predetermined voltage, e.g., 1 V, is applied to a bit line selected from the plurality of bit lines to precharge the bit line, and 0 V is applied to the other non-selected bit lines and source lines SL.

Afterwards, a voltage, e.g., a supply voltage Vcc (not shown), that fully turns on the drain selection transistor and the source selection transistor is applied to the selected drain selection line DSL and the selected source selection line SSL to connect the selected string to the bit lines BL and source lines SL. A turn off voltage, e.g., 0 V (not shown), is applied to the other non-selected drain selection lines DSL and source selection lines SSL to prevent them from being connected to the bit lines BL and the source lines SL.

A read voltage Vread, e.g., 0 V (not shown) is subsequently applied to the word line WL selected from the plurality of word lines, and a pass voltage Vread-pass1, e.g., 4 to 5 V (not shown), is applied to the other non-selected word lines WL. As a result, the channels of the first and second vertical strings ST1 and ST2 are inverted from the p type to the n type, and the n-type ion implantation region J formed in the active regions 10A of the semiconductor substrate 10 causes the channels of the first and second vertical strings ST1 and ST2 to be electrically connected. During this reading operation, 0 V may be applied to the semiconductor substrate 10 or it may be in a floating state.

After applying a voltage in the above manner, current flow through the selected string is generated to detect whether there is any change in a voltage of the selected bit line BL, so that data stored in the selected memory cell is read.

Next, the program operations will be described. A program voltage, e.g., 0 V (not shown), is applied to a bit line BL selected from the plurality of bit lines, and a voltage preventing a bit line program, e.g., a supply voltage Vcc (not shown), is applied to the non-selected bit lines BL.

Subsequently, a voltage, e.g., a supply voltage Vcc (not shown), that fully turns on the drain selection transistor is applied to the selected drain selection line DSL to connect the selected string to the bit lines BL. A turn-off voltage, e.g., 0 V (not shown) is applied to the non-selected drain selection line DSL to prevent the drain selection line DSL from being connected to the bit lines BL. A turn-off voltage, e.g., 0 V (not shown), is applied to all source selection lines SSL to prevent the source selection lines SSL from being connected to the source lines SL to which the supply voltage Vcc (not shown) is applied. That is, the selected string is connected only to the selected bit lines, sel. BL (not shown), to which 0 V is applied.

Afterwards, a program voltage Vpgm, e.g., 18 to 20 V (not shown), is applied to a word line WL selected from the plurality of word lines, and a pass voltage Vpass1, e.g., about 10 V (not shown), is applied to the non-selected word lines WL. As a result, the channels of the first and second vertical strings ST1 and ST2 are inverted from a p type to an n type, and the channels of the first and second vertical strings ST1 and ST2 are electrically connected to each other by the n-type ion implantation region J formed in the active regions 10A of the semiconductor substrate 10. During the program operation, the semiconductor substrate 10 may be applied with 0 V or may be in a floating state.

After applying a voltage in the above manner, electrons are implanted into the charge storage layer of the selected memory cell connected to the selected word line WL, so that a program operation of storing data in the selected memory cell may be performed.

Next, the erase operation will be described. The erase operation may be performed in units of blocks. When 0 V is applied to the plurality of word lines WL of a block to be erased and a high voltage of 18 to 20 V is applied to the semiconductor substrate 10 as an erase voltage Verase (not shown), holes are injected into the channels so that data is erased. All of the bit lines BL, the source lines SL, the drain selection line DSL, the source selection line SSL, and a lower gate BG (not shown) may be in a floating state.

In contrast, word lines WL of a block that are not subject to erasure are in a floating state. When the word lines WL are in a floating state, an erase voltage Verase is applied to the semiconductor substrate 10 to provide a boost in potential, so that data of memory cells is prevented from being erased.

FIGS. 2 to 10 are cross-sectional views illustrating a method of fabricating a non-volatile memory device according to another embodiment of the present invention.

Figure 2:
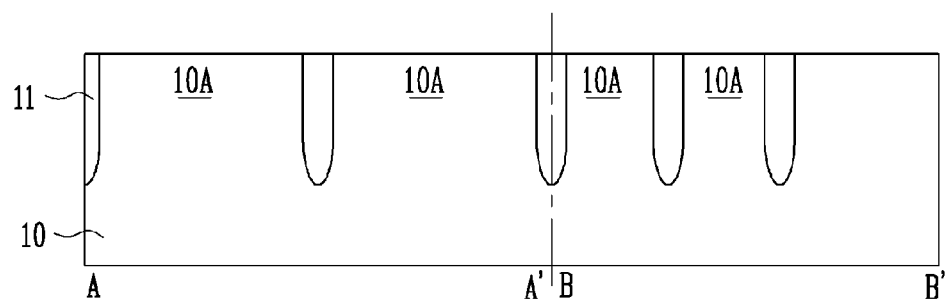

Referring to FIG. 2, a semiconductor substrate 10 formed of a p-type semiconductor is provided. A direction A-A' of the semiconductor substrate 10 denotes a first direction of the non-volatile memory device illustrated in FIG. 1, and a direction B-B' of the semiconductor substrate 10 denotes a second direction of the non-volatile memory device illustrated in FIG. 1.

An isolation region of the semiconductor substrate 10 is selectively etched to form a trench for isolation, which in turn is filled with an insulating layer such as an oxide layer or a nitride layer, so that an isolation layer 11 is formed. Active regions 10A of the semiconductor substrate 10 are defined by the isolation layer 11.

Figure 3:
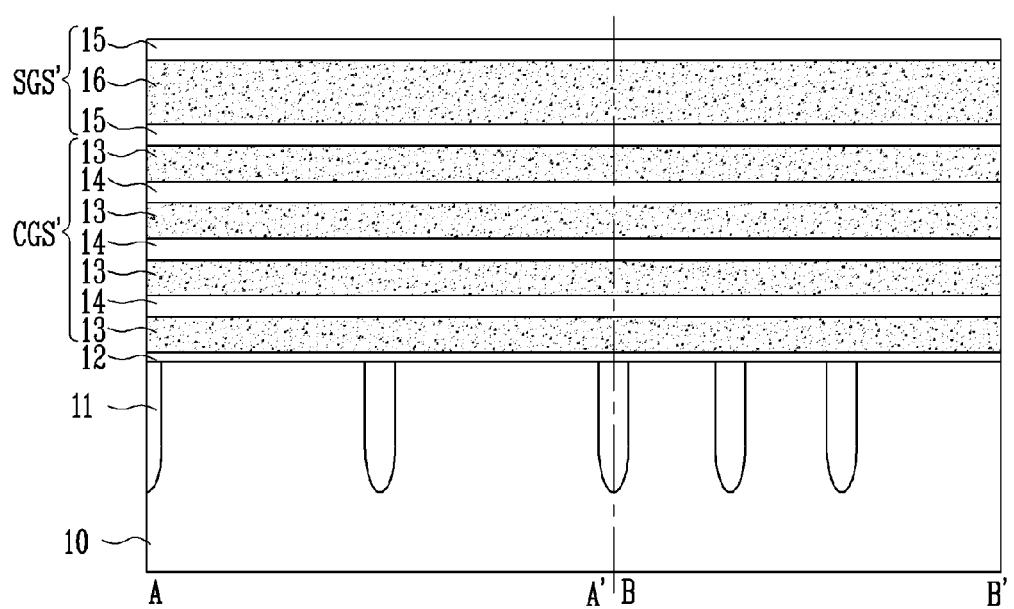

Referring to FIG. 3, a gate insulating layer 12 is formed on the substrate 10 including the isolation layer 11. The gate insulating layer 12 may be an oxide layer or a nitride layer, and may be formed with a thickness enabling the active regions 10A to be electrically separated from a gate layer formed in a subsequent process.

Afterwards, a plurality of first sacrificial layers 13 and a plurality of first interlayer insulating layers 14 are alternately stacked on the gate insulating layer 12. The first sacrificial layers 13 may be removed in a subsequent process, and may be formed of a layer, e.g., a nitride layer, providing a space in which word lines are to be formed. The first interlayer insulating layers 14 may be provided to separate the multi-layered word lines, and may be formed of an oxide layer having an etch selectivity with respect to the first sacrificial layers 13.

A structure in which the plurality of first sacrificial layers 13 and the plurality of first interlayer insulating layers 14 are alternately stacked will be referred to as an initial cell gate structure (CGS') for clarity.

Subsequently, a second interlayer insulating layer 15, a second sacrificial layer 16, and another second interlayer insulating layer 15 are sequentially stacked on the initial cell gate structure CGS'. The second sacrificial layer 16 may be removed in a subsequent process, and may be formed of a layer, e.g., a nitride layer, providing a space in which a drain selection line and a source selection line are formed. The second interlayer insulating layer 15 may be provided to separate upper and lower parts of the selection lines, and may be formed of an oxide layer. A structure in which the second interlayer insulating layer 15, the second sacrificial layer 16, and the second interlayer insulating layer 15 are sequentially stacked will be referred to as an initial selection gate structure (SGS') for clarity.

Figure 4:
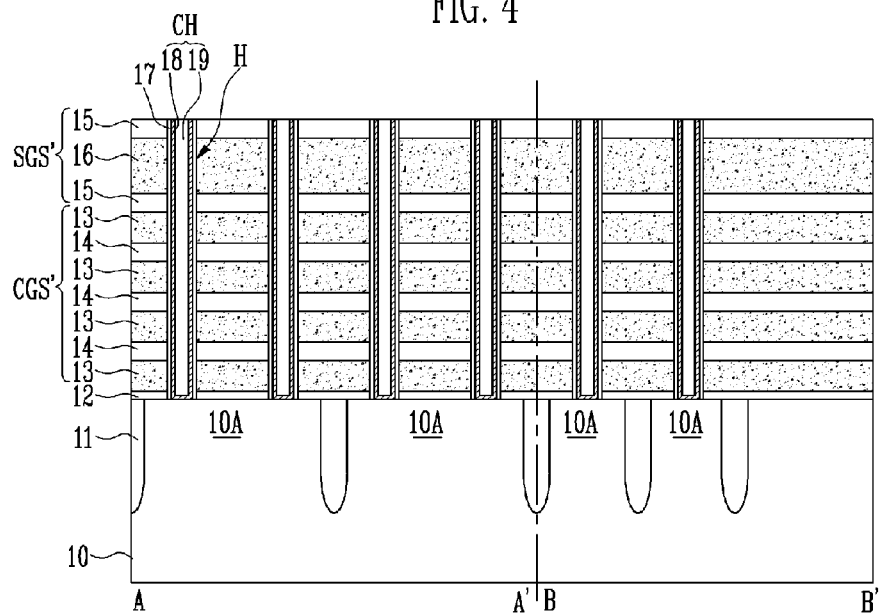

Referring to FIG. 4, a channel hole H penetrating the initial cell gate structure CGS', the initial selection gate structure SGS', and the gate insulating layer 12 and exposing the active regions 10A is formed. A pair of channel holes H are formed in each active region 10A. The pair of channel holes H are arranged vertically in a first direction that is parallel with the active regions 10A.

A memory layer 17 is formed on a sidewall of the channel hole H, and may include a tunnel insulating layer, a charge storage layer, and a charge blocking layer that are sequentially stacked therein. The tunnel insulating layer may be formed of an oxide layer, the charge storage layer may be formed of a nitride layer, and the charge blocking layer may be formed of an oxide layer.

A channel layer 18 is formed on a surface of the memory layer 17 and on the exposed active regions 10A. The channel layer 18 may be formed of a polysilicon layer doped with p-type impurities and may be directly connected to the p-type semiconductor substrate 10.

A space of the channel hole H left after forming the channel layer 18 may be filled with a channel insulating layer 19 such as PSZ. Therefore, a channel CH including the channel layer 18 and the channel insulating layer 19 is formed in the channel hole H, and two channels CH are formed in one active region 10A.

Figure 5:
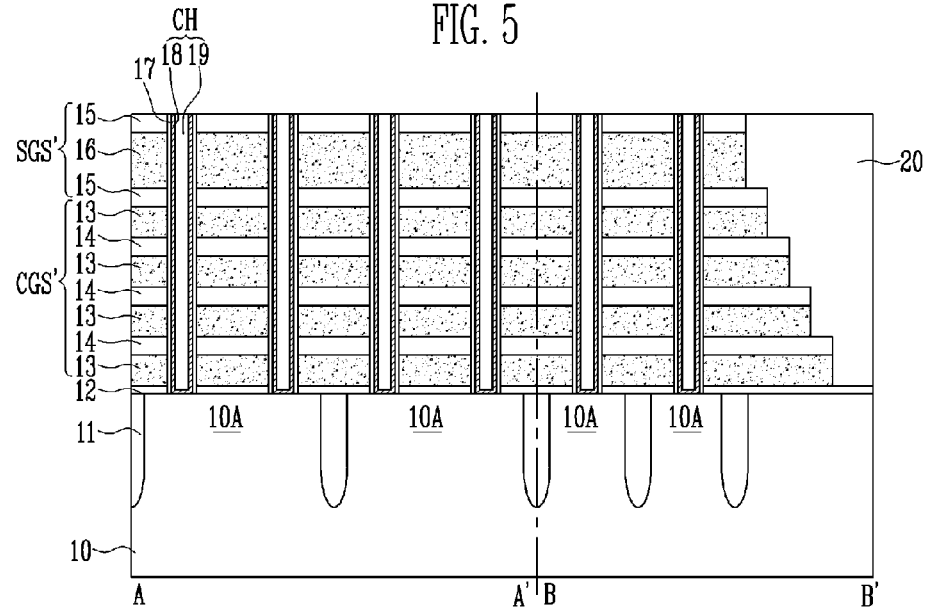

Referring to FIG. 5, the initial cell gate structure CGS' and initial selection gate structure SGS' of an end region in the second direction of the semiconductor substrate 10 are etched in a step shape manner. Etching the stacked structure is performed using an etch process known as slimming, and since this process has been widely known, a detailed description thereof will be omitted.

As a result of this process, an end of a first sacrificial layer 13 in the end region of the semiconductor substrate 10 protrudes more than that of another first sacrificial layer 13 immediately above the first sacrificial layer and a second sacrificial layer 16. This process is performed for the subsequent contact formation process (refer to FIG. 10).

A third interlayer insulating layer 20 filling the etched space is then formed. The third interlayer insulating layer 20 may be formed of an oxide layer.

Figure 6:
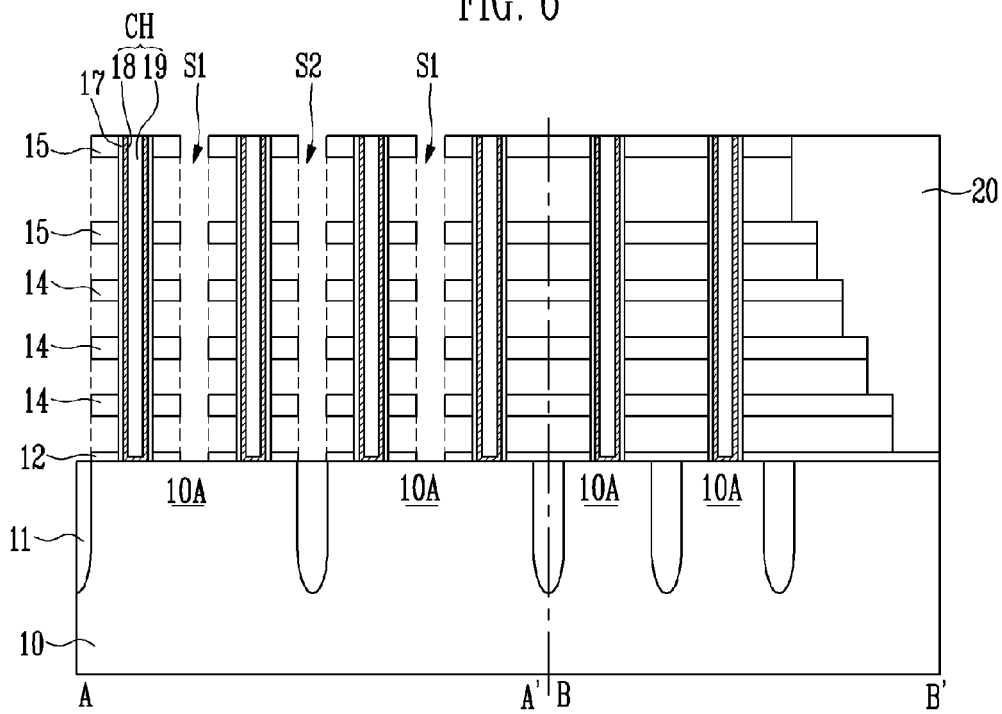

Referring to FIG. 6, the initial cell gate structure CGS', the initial selection gate structure SGS', and the gate insulating layer 12 are selectively etched to form first and second slits S1 and S2 partially exposing the active regions 10A of the semiconductor substrate 10 and the isolation layer 11 and penetrating the initial cell gate structure CGS' and the initial selection gate structure SGS'.

The first slit S1 is disposed between the pair of channels CH formed in each active region 10A and extends in the second direction, and the second slit S2 is disposed between the other adjacent pair of channels CH and extends in the second direction.

The plurality of first sacrificial layers and the plurality of second sacrificial layers exposed by the first and second slits S1 and S2 are then removed.

Figure 7:
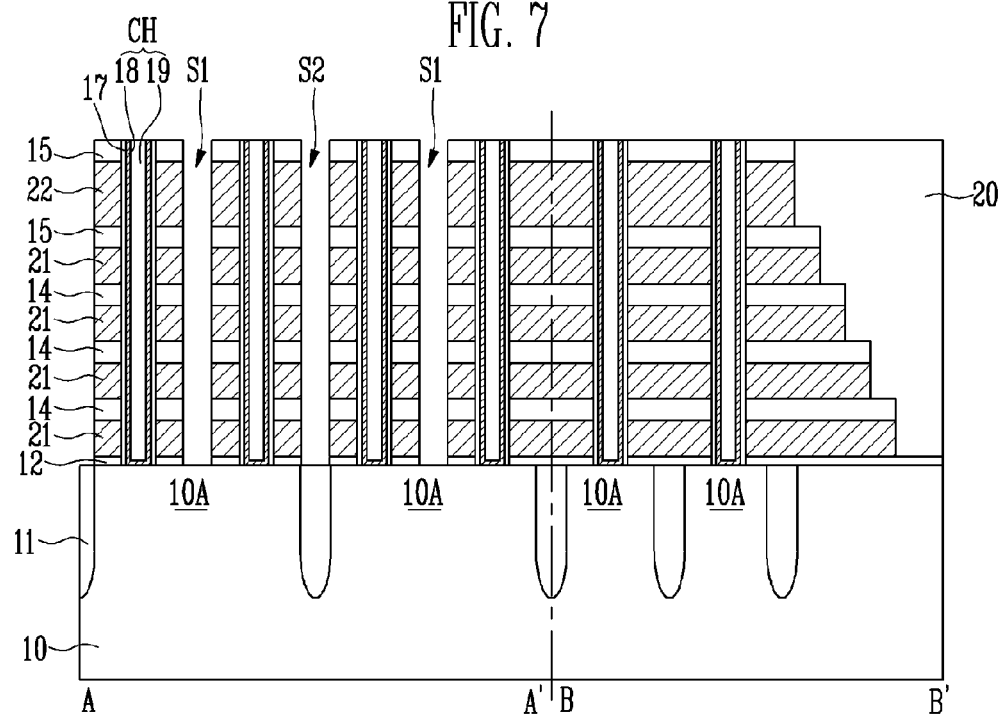

Referring to FIG. 7, word lines 21 and selection lines 22 are formed only within the space from which the first and second sacrificial layers are removed. The word lines 21 may be formed of a metal material such as tungsten or polysilicon doped with impurities. The word lines 21 and the selection lines 22 are formed along the entire surface from which the first and second sacrificial layers are removed, and remain only in the space from which the first and second sacrificial layers are removed by slimming.

As a result of this process, the word lines 21 in contact with the memory layer 17 are formed in the space from which the first sacrificial layers are removed, and the selection lines 22 in contact with the memory layer 17 are formed in the space from which the second sacrificial layers are removed. The memory layer 17 is interposed between the channel layer 18 and the word lines 21 to provide insulation therebetween and to store charges. In contrast, the memory layer 17 in contact with the selection lines 22 formed in the space from which the second sacrificial layers are removed is interposed between the channel layer 18 and the selection lines 22 due to process characteristics of an embodiment of the present invention, and functions as a gate insulating layer. When a process is modified in another embodiment, a single insulating layer may be interposed between the channel layer 18 and the selection lines 22 instead of the memory layer 17. When selection lines 22 in contact with one channel CH of the pair of channels CH constitute a drain selection line, the other selection lines 22 in contact with the other channel CH constitute a source selection line.

Referring to FIG. 8, an ion implantation process is performed on the active regions 10A of the semiconductor substrate 10 exposed through the first slits S1 to form a plurality of ion implantation regions J and may be performed by implanting n-type impurities. Afterwards, an annealing process is performed such that the ion implantation regions J are diffused. The ion implantation region J is formed such that the pair of channels CH are in contact with each ion implantation region J, and a lower end of the channel is formed to be in contact with a boundary between the ion implantation region J and the active region 10A. That is, each channel CH is directly connected to the n-type ion implantation region J and the p-type active region 10A.

Referring to FIG. 9, the selection lines 22 and the space left after forming the word lines 21 are filled with an insulating layer 23. That is, the spaces corresponding to the first and second slits are filled with the insulating layer 23. The insulating layer 23 may be formed of an oxide layer.

After the channel insulating layer 19 at an upper end of the channel CH is removed, conductive layers 24A and 24B are formed in areas in which the channel insulating layer 19 has been removed. The conductive layer 24A is a drain region, and the conductive layer 24B is a source region.

Figure 10:
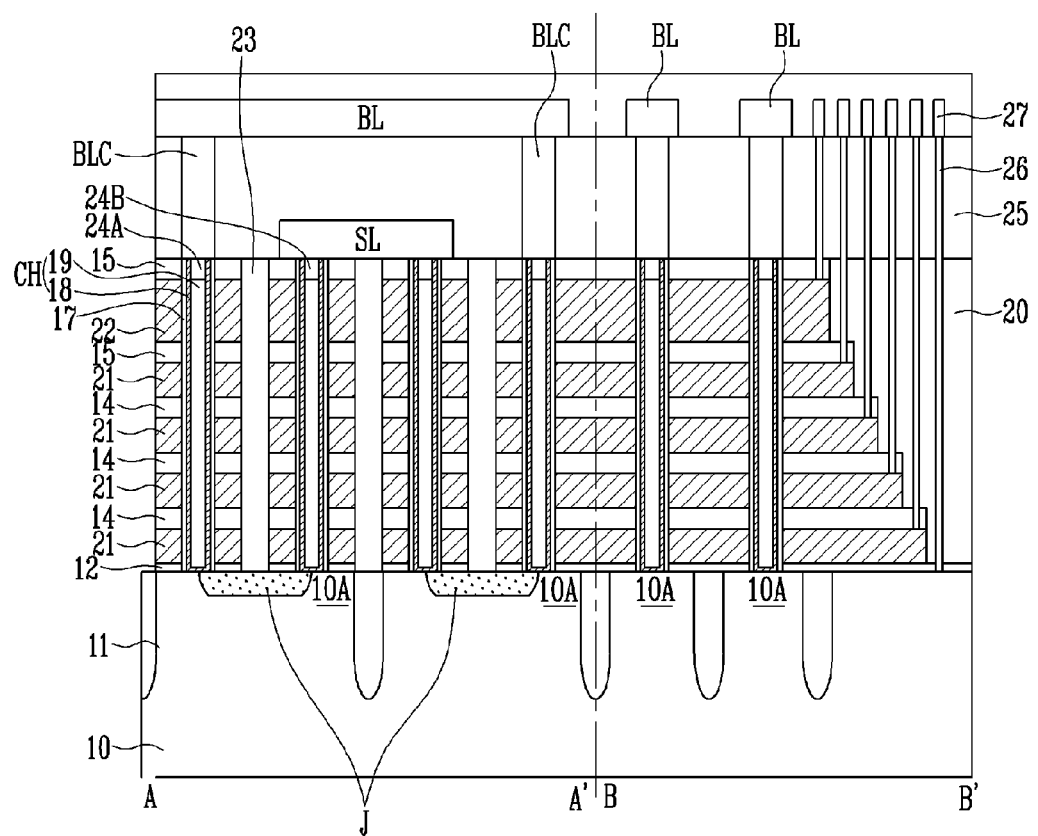

Referring to FIG. 10, a conductive material is deposited on the structure in FIG. 9, and the deposited material is patterned to form a source line SL in contact with adjacent channels that belong to different pairs and extending in the second direction. A metal or metal silicide may be used as the conductive material to reduce the resistance of the source line SL.

A fourth interlayer insulating layer 25 covering the source line SL is then formed. A bit line contact (BLC) penetrating the fourth interlayer insulating layer 25 and in contact with the channel CH in which the drain region 24A is formed is formed. Also, a plurality of contacts 26 penetrating the fourth interlayer insulating layer 25 and the third interlayer insulating layer 20 to be connected to the selection line 22, the word line 21, and the active region 10A of the semiconductor substrate 10 is formed.

A conductive material is deposited on the fourth interlayer insulating layer 25 and patterned, so that bit lines connected to the bit line contact BLC and extending in the first direction, and interconnections 27 connected to the plurality of contacts 26 are formed. The interconnections 27 may control an erase voltage applied to the selection lines 22, the word lines 21, and the semiconductor substrate 10.

Consequently, the device of FIG. 1 may be fabricated.

However, the method of fabricating the device illustrated in FIG. 1 is not limited thereto, and various modifications may be made. For example, instead of the first and second sacrificial layers 13 and 16, a method of directly depositing conductive layers for the word lines and selection lines may be employed.

Figure 11:
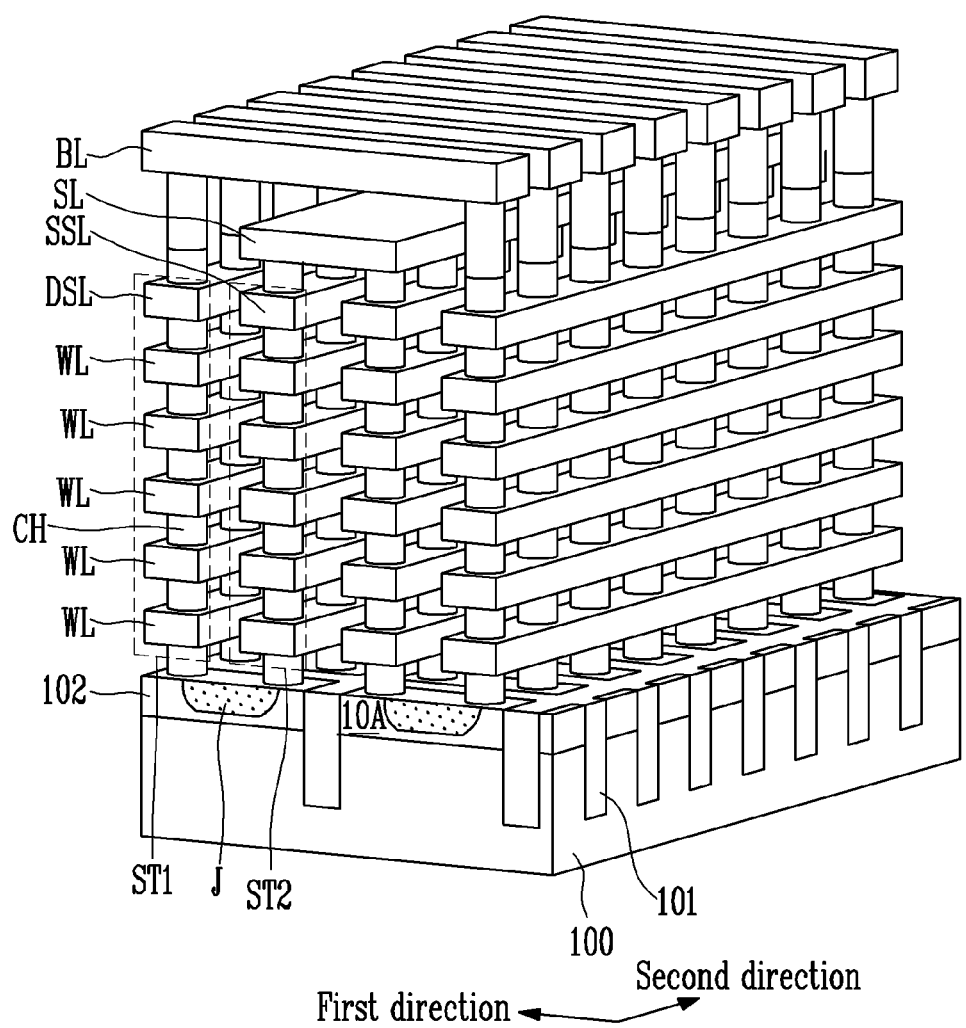
FIG. 11 is a perspective view of a non-volatile memory device according to a another embodiment of the present invention.

FIG. 11 is a perspective view of a non-volatile memory device according to another embodiment of the present invention.

Referring to FIG. 11, the non-volatile memory device according to another embodiment includes a conductive layer 102 for applying an erase voltage formed on a p-type semiconductor substrate and a pair of vertical strings ST1 and ST2 formed on the conductive layer 102 for applying an erase voltage. Also, a plurality of n-type ion implantation regions J in partial contact with the pair of vertical strings ST1 and ST2 are formed on an upper surface of the conductive layer 102 for applying an erase voltage, thereby electrically connecting the pair of vertical strings ST1 and ST2 may be electrically connected to each other via the ion implantation region J. The pair of vertical strings ST1 and ST2 are formed at a boundary between the ion implantation region J and the conductive layer 102 for applying an erase voltage. That is, each of the pair of vertical strings ST1 and ST2 is connected to both the ion implantation region J and the conductive layer 102 for applying an erase voltage.

More specifically, the plurality of conductive layers 102 for applying an erase voltage formed on the semiconductor substrate 100 are arranged in first and second directions in a matrix form. FIG. 11 depicts each of the conductive layers 102 for applying an erase voltage formed in a bar-type planar shape manner having a long axis in the first direction and a short axis in the second direction. Also, the conductive layers 102 for applying an erase voltage are isolated from each other by the isolation layer 101 formed to a predetermined depth. The conductive layer 102 for applying an erase voltage is formed of the same p-type polysilicon as the semiconductor substrate 100. The ion implantation region J is disposed in a portion of the conductive layer 102 for applying an erase voltage, and the ion implantation region J is formed as an n type.

Each of the conductive layers 102 for applying an erase voltage includes the pair of vertical strings ST1 and ST2 disposed therein. One of the pair of vertical strings ST1 and ST2 connected to the bit line BL is referred to as a first vertical string ST1, and the other connected to the source line SL is referred to as a second vertical string ST2. The first vertical string ST1 includes channels CH whose lower ends are in contact with an upper part of the boundary between the conductive layer 102 for applying an erase voltage and the ion implantation region J and protrude in a vertical direction, a plurality of word lines WL and a plurality of drain selection lines DSL stacked along the channels CH, a memory layer (not shown) interposed between the word lines WL and the channels CH, and gate insulating layers (not shown) between the drain selection lines DSL and the channels CH. Similarly, the second vertical string ST2 includes channels CH whose lower ends are in contact with an upper part of the boundary between the conductive layer 102 for applying an erase voltage and the ion implantation region J and protrude in a vertical direction, a plurality of word lines WL and a source selection line SSL stacked along the channels CH, a memory layer (not shown) interposed between the word lines WL and the channels CH, and gate insulating layers (not shown) between the source selection line SSL and the channels CH.

The memory layer performs a function of insulating the channels CH from the word lines WL and storing charges. The memory layer may include a tunnel insulating layer disposed close to the channels CH to enable tunneling of the charges, a charge blocking layer disposed close to the word lines WL, and a charge storage layer interposed between the tunnel insulating layer and the charge blocking layer to store charges. The tunnel insulating layer and the charge blocking layer may be formed of an oxide layer, and the charge storage layer may be formed of a nitride layer having a function of trapping charges.

An interlayer insulating layer that is not shown is interposed between the word lines WL, between the word line WL and the drain selection line DSL, and between the word line WL and the source selection line SSL to provide insulation therebetween. The memory layer in contact with one channel CH and a word line WL constitutes a unit memory cell, the gate insulating layer in contact with one channel CH and the drain selection line DSL constitutes a drain selection transistor, and the gate insulating layer in contact with one channel CH and the source selection line SSL constitutes a source selection transistor. The word lines WL, the drain selection lines DSL, and the source selection lines SSL extend in the second direction and are in contact with the channels CH arranged in the second direction.

The bit lines BL are connected to upper ends of the channels CH of the first vertical string ST1 and extend in the first direction. The source lines SL are connected to upper ends of the channels CH of the second vertical string ST2 and extend in the second direction. The above-described drain selection transistor controls the connection between the bit lines BL and the first vertical strings ST1, and the source selection transistor controls the connection between the source lines SL and the second vertical strings ST2.

Although one block is depicted to include two U-shaped strings in the first direction in FIG. 1, the invention is not limited thereto, and the number of U-shaped strings included in one block may be variously modified.

A U-shaped second vertical string ST2 and another adjacent U-shaped second vertical string ST2 in the first direction may be disposed adjacent to each other, and may share the source line SL, accordingly. The first vertical strings ST1 arranged in the first direction may share a bit line BL.

According to the non-volatile memory device according to another embodiment of the present invention, the following effects may be obtained.

First, both the bit line BL and the source line SL are disposed on upper parts of the first and second vertical strings ST1 and ST2 to enable the bit line BL and the source line SL to exhibit low resistance such as a metal in order to reduce line resistance. Further, since the drain selection transistor and the source selection transistor are formed on the same layer, the integration intensity in the vertical direction may be improved.

Moreover, the channels CH of the first and second vertical strings ST1 and ST2 are directly connected to the conductive layer 102 for applying an erase voltage formed on the semiconductor substrate 100 formed of a p-type semiconductor. Therefore, when a positive high voltage is applied to the conductive layer 102 for applying an erase voltage in order to perform an erase operation by injecting holes into the channel CH to obtain excellent erase efficiency.

As previously described, even if the channels CH of the first and second vertical strings ST1 and ST2 are directly connected to the conductive layer 102 for applying an erase voltage, they may be directly connected to the ion implantation region J formed in the conductive layer 102 for applying an erase voltage as well, thus directly connecting the first vertical string ST1 to the second vertical string ST2 by the n-type ion implantation region J during reading and program operations. Therefore, the operations are not influenced.

Thus, the non-volatile memory device according to another embodiment of the present invention may perform an erase operation in a manner of injecting holes into the channels CH by applying a positive high voltage to the semiconductor substrate 100 with only advantageous effects obtained from conventional PBiCS and TCAT structures. Further, the channels CH of the first and second vertical strings ST1 and ST2 inverted to an n type by the voltage applied to the word lines during the reading and program operations are connected to each other by the n-type ion implantation region J.

The detailed operation method will now be described.

The reading operation will first be described. First of all, a predetermined voltage, e.g., 1 V, is applied to a bit line selected from the plurality of bit lines to precharge the bit line, and 0 V is applied to the other non-selected bit lines and source lines SL.

Afterwards, a voltage, e.g., a supply voltage Vcc (not shown), that fully turns on the drain selection transistor and the source selection transistor is applied to the selected drain selection line DSL and the selected source selection line SSL to connect the selected string to the bit lines BL and source lines SL. A turn off voltage, e.g., 0 V (not shown), is applied to the other non-selected drain selection lines DSL and source selection lines SSL to prevent them from being connected to the bit lines BL and the source lines SL.

A read voltage Vread, e.g., 0 V (not shown), is subsequently applied to the word line WL selected from the plurality of word lines, and a pass voltage Vread-pass1, e.g., 4 to 5 V (not shown), is applied to the other non-selected word lines WL. As a result, the channels of the first and second vertical strings ST1 and ST2 are inverted from the p type to the n type, and the n-type ion implantation region J formed in the conductive layer 102 for applying an erase voltage of the semiconductor substrate 100 causes the channels of the first and second vertical strings ST1 and ST2 to be electrically connected. During this reading operation, 0 V may be applied to the conductive layer 102 for applying an erase voltage or it may be in a floating state.

After applying a voltage in the above manner, current flow through the selected string is generated to detect whether there is any change in a voltage of the selected bit line BL, so that data stored in the selected memory cell are read.

Next, the program operations will be described. A program voltage, e.g., 0 V (not shown), is applied to a bit line BL selected from the plurality of bit lines, and a voltage preventing a bit line program, e.g., a supply voltage Vcc (not shown), is applied to the other non-selected bit lines BL.

Subsequently, a voltage, e.g., a supply voltage Vcc (not shown), that fully turns on the drain selection transistor is applied to the selected drain selection line DSL to connect the selected string to the bit lines BL. A turn-off voltage, e.g., 0 V (not shown) is applied to the non-selected drain selection line DSL to prevent the drain selection line DSL from being connected to the bit lines BL. A turn-off voltage, e.g., 0 V (not shown), is applied to all of the source selection lines SSL to prevent the source selection lines SSL from being connected to the source lines SL to which the supply voltage Vcc (not shown) is applied. That is, the selected string is connected only to the selected bit lines, sel. BL (not shown) to which 0 V is applied.

Afterwards, a program voltage Vpgm, e.g., 18 to 20 V (not shown), is applied to a word line WL selected from the plurality of word lines, and a pass voltage Vpass1, e.g., about 10 V (not shown), is applied to the other non-selected word lines WL. As a result, the channels of the first and second vertical strings ST1 and ST2 are inverted from the p type to the n type, and the channels of the first and second vertical strings ST1 and ST2 are electrically connected to each other by the n-type ion implantation region J formed in the conductive layer 102 for applying an erase voltage of the semiconductor substrate 100. During the program operation, the conductive layer 102 for applying an erase voltage may be applied with 0 V or may be in a floating state.

After applying a voltage in the above manner, electrons are injected into the charge storage layer of the selected memory cell connected to the selected word line WL, so that the program operation of storing data in the selected memory cell may be performed.

Next, the erase operation will be described. The erase operation may be performed in units of blocks. When 0 V is applied to the plurality of word lines WL of a block to be erased and a high voltage of 18 to 20 V is applied to the conductive layer 102 for applying an erase voltage as an erase voltage Verase (not shown), holes are injected into the channels, so that data is erased. All of the bit lines BL, the source lines SL, the drain selection line DSL, the source selection line SSL, and a lower gate BG (not shown) may be in a floating state.

In contrast, word lines WL of a block that are not subject to erasure are in a floating state. When the word lines WL are in the floating state, an erase voltage Verase is applied to the conductive layer 102 for applying an erase voltage to provide a boost in potential, so that data of memory cells is prevented from being erased.

FIGS. 12 to 20 are cross-sectional views illustrating a method of fabricating a non-volatile memory device according to another embodiment of the present invention.

Figure 12:
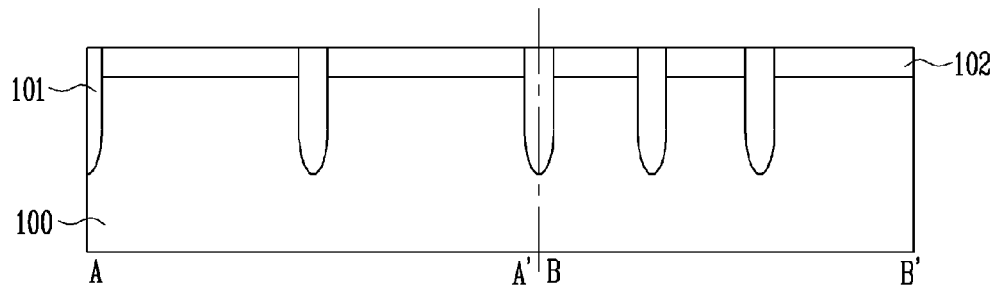

Referring to FIG. 12, a semiconductor substrate 100 formed of a p-type semiconductor is provided. A direction A-A' of the semiconductor substrate 100 denotes a first direction of the non-volatile memory device illustrated in FIG. 1, and a direction B-B' of the semiconductor substrate 100 denotes a second direction of the non-volatile memory device illustrated in FIG. 1.

A conductive layer 102 for applying an erase voltage is then formed on the semiconductor substrate 100. The conductive layer 102 for applying an erase voltage may be formed of a p-type polysilicon layer.

The conductive layer 102 for applying an erase voltage and an isolation region of the semiconductor substrate 100 are selectively etched to form a trench for isolation, which in turn is filled with an insulating layer such as an oxide layer or a nitride layer, so that an isolation layer 101 is formed.

Figure 13:
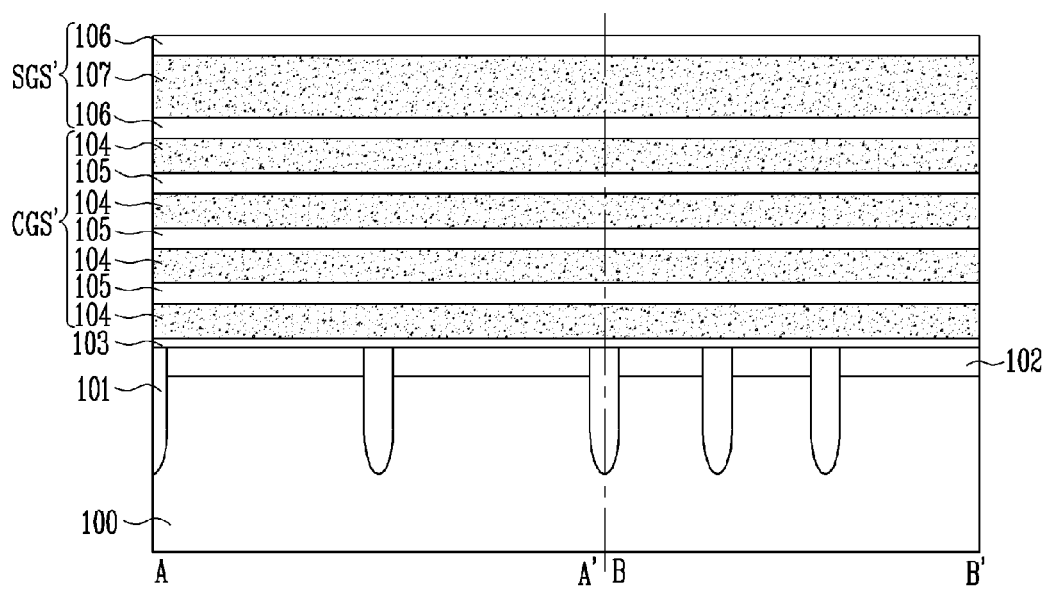

Referring to FIG. 13, a gate insulating layer 103 is formed on the conductive layer 102 for applying an erase voltage including the isolation layer 101. The gate insulating layer 103 may be formed of an oxide layer or a nitride layer, and may be formed with a thickness enabling the conductive layer 102 for applying an erase voltage to be electrically insulated from a gate layer formed in a subsequent process.

Afterwards, a plurality of first sacrificial layers 104 and a plurality of first interlayer insulating layers 105 are alternately stacked on the gate insulating layer 103. The first sacrificial layers 104 may be removed in a subsequent process to provide space in which word lines may be formed, and may be formed of a layer such as a nitride layer. The first interlayer insulating layers 105 may be provided to separate the multi-layered word lines, and may be formed of an oxide layer having an etch selectivity with respect to the first sacrificial layers 104.

A structure in which the plurality of first sacrificial layers 104 and the plurality of first interlayer insulating layers 105 are alternately stacked will be referred to as an initial cell gate structure (CGS') for clarity.

Subsequently, a second interlayer insulating layer 106, a second sacrificial layer 107, and another second interlayer insulating layer 106 are sequentially stacked on the initial cell gate structure CGS'. The second sacrificial layer 107 may be removed in a subsequent process to provide space in which a drain selection line and a source selection line may be formed, and may be formed of a layer, e.g., a nitride layer. The second interlayer insulating layer 106 may be provided to separate an upper part of the selection line from a lower part thereof, and may be formed of an oxide layer. A structure in which the second interlayer insulating layer 106, the second sacrificial layer 107, and the second interlayer insulating layer 106 are sequentially stacked will be referred to as an initial selection gate structure (SGS') for clarity.

Figure 14:
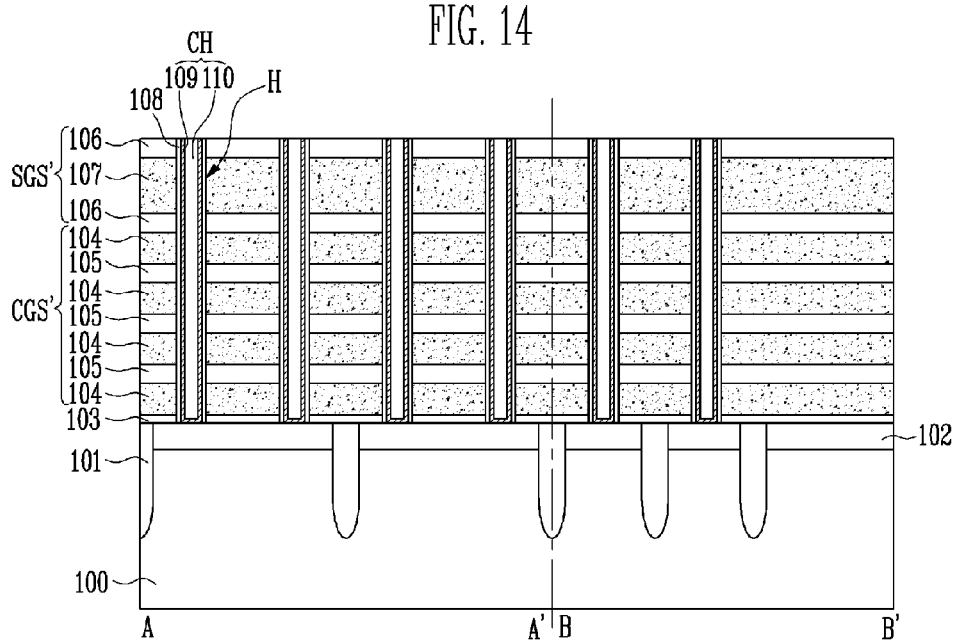

Referring to FIG. 14, a channel hole H penetrating the initial cell gate structure CGS', the initial selection gate structure SGS', and the gate insulating layer 103 and exposing the conductive layer 102 for applying an erase voltage is formed. A pair of channel holes H are formed in each conductive layer 102 for applying an erase voltage. The pair of channel holes H are arranged vertically in the first direction that is parallel with the conductive layer 102 for applying an erase voltage.

A memory layer 108 is formed on a sidewall of the channel hole H, and may include a tunnel insulating layer, a charge storage layer, and a charge blocking layer that are sequentially stacked therein. The tunnel insulating layer may be formed of an oxide layer, the charge storage layer may be formed of a nitride layer, and the charge blocking layer may be formed of an oxide layer.

A channel layer 109 is formed on a surface of the memory layer 108 and the exposed conductive layer 102 for applying an erase voltage. The channel layer 109 may be formed of a polysilicon layer doped with p-type impurities and may be directly connected to the p-type conductive layer 102 for applying an erase voltage.

A space of the channel hole H left after forming the channel layer 109 may be filled with a channel insulating layer 110 such as PSZ. Therefore, a channel CH including the channel layer 109 and the channel insulating layer 110 is formed in the channel hole H, and two channels H are formed in one conductive layer 102 for applying an erase voltage.

Figure 15:
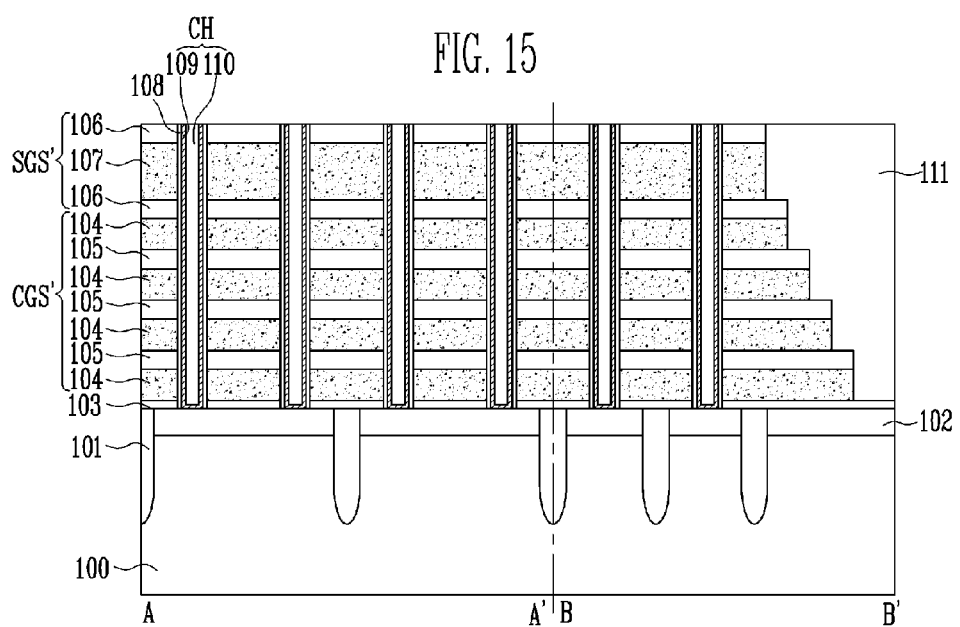

Referring to FIG. 15, the initial cell gate structure CGS' and initial selection gate structure SGS' of an end region in the second direction of the semiconductor substrate 100 are etched in a step shape manner. Etching the stacked structure is performed using an etch process known as slimming, and since this process is widely known, a detailed description thereof will be omitted.

As a result of this process, an end of a first sacrificial layer 104 in the end region of the semiconductor substrate 100 protrudes more than that of another first sacrificial layer 104 immediately above the first sacrificial layer and a second sacrificial layer 107. This process is performed for the subsequent contact formation process (refer to FIG. 20).

A third interlayer insulating layer 111 filling the etched space is then formed. The third interlayer insulating layer 111 may be formed of an oxide layer.

Figure 16:
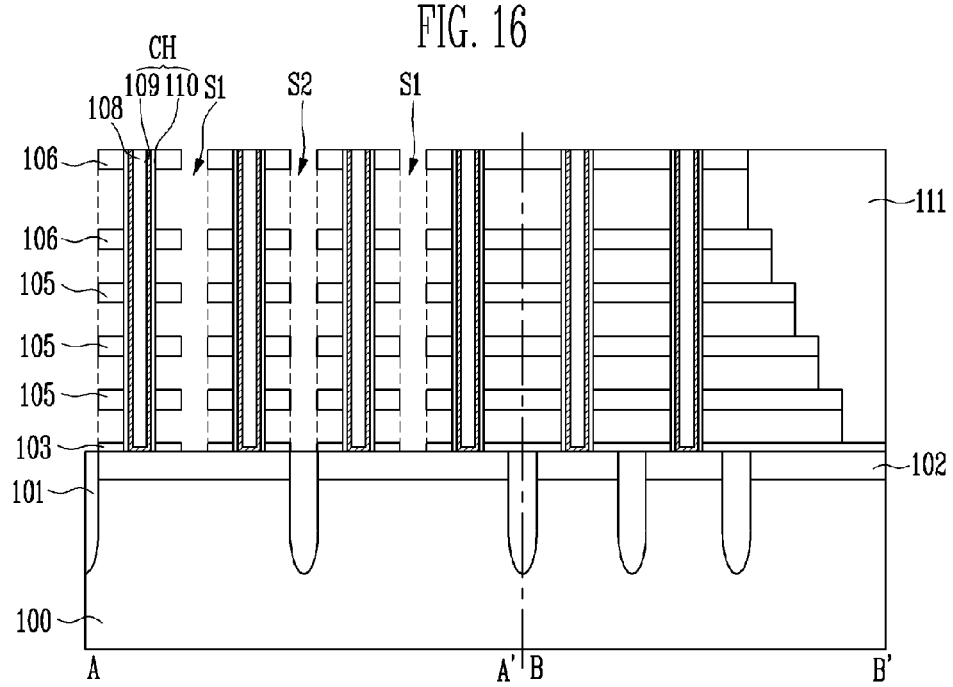

Referring to FIG. 16, the initial cell gate structure CGS', the initial selection gate structure SGS', and the gate insulating layer 103 are selectively etched to form first and second slits S1 and S2 partially exposing the conductive layer 102 for applying an erase voltage and the isolation layer 101 and penetrating the initial cell gate structure CGS' and the initial selection gate structure SGS'.

The first slit S1 is disposed between the pair of channels CH formed in each conductive layer 102 for applying an erase voltage and extends in the second direction, and the second slit S2 is disposed between the other adjacent pair of channels CH and extends in the second direction.

The plurality of first sacrificial layers and the plurality of second sacrificial layers exposed by the first and second slits S1 and S2 are then removed.

Figure 17:
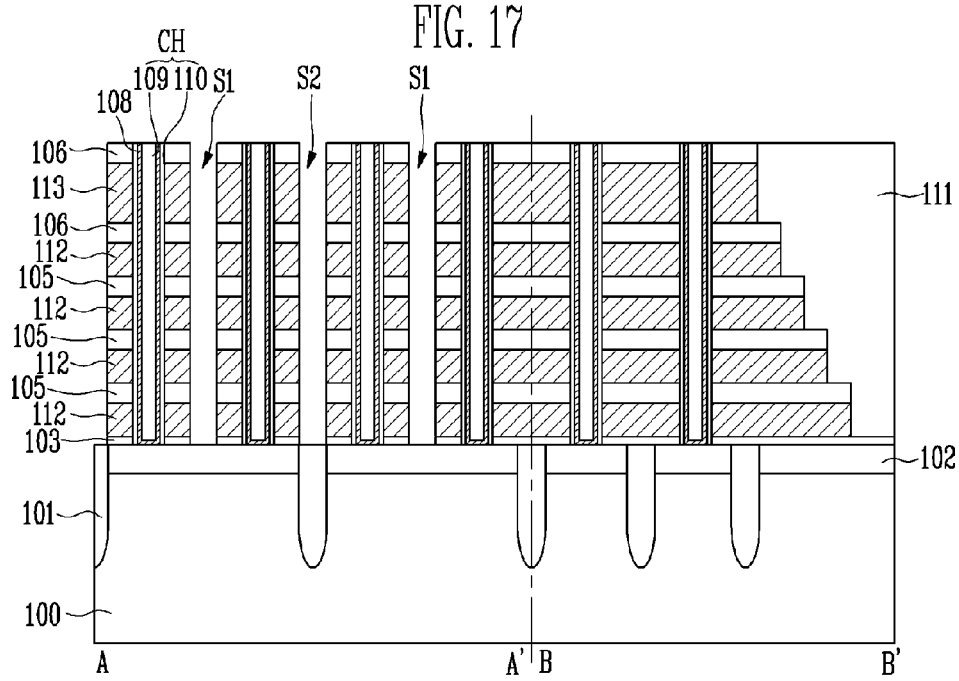

Referring to FIG. 17, word lines 112 and selection lines 113 are formed only within the space from which the first and second sacrificial layers are removed. The word lines 112 and the selection lines 113 may be formed of a metal material such as tungsten or polysilicon doped with impurities. The word lines 112 and the selection lines 113 are formed along the entire surface from which the first and second sacrificial layers are removed, and remain only in the space from which the first and second sacrificial layers are removed by slimming.

As a result of this process, the word lines 112 in contact with the memory layer 108 are formed in the space from which the first sacrificial layers are removed, and the selection lines 113 in contact with the memory layer 108 are formed in the space from which the second sacrificial layers are removed. The memory layer 108 is interposed between the channel layer 109 and the word lines 112 to provide insulation therebetween and to store charges. In contrast, the memory layer 108 in contact with the selection lines 113 formed in the space from which the second sacrificial layers are removed is interposed between the channel layer 109 and the selection lines 113 due to process characteristics of another embodiment of the present invention, and functions as a gate insulating layer. When the process is modified in another embodiment, a single insulating layer may be interposed between the channel layer 109 and the selection lines 113 instead of the memory layer 108. When one selection line 113 in contact with one channel CH of the pair of channels CH constitutes a drain selection line, the other selection line 113 in contact with the other channel CH constitutes a source selection line.

Referring to FIG. 18, an ion implantation process is performed on the conductive layer 102 for applying an erase voltage exposed through the first slits S1 to form a plurality of ion implantation regions J and may be performed by implanting n-type impurities. Afterwards, an annealing process is performed such that the ion implantation region J is diffused. The ion implantation regions J are formed such that the pair of channels CH are in contact with each ion implantation region J, and a lower end of the channel is formed to be in contact with a boundary between the ion implantation region J and the active region 10A. That is, each channel CH is directly connected to the n-type ion implantation region J and the p-type conductive layer 102 for applying an erase voltage.

Referring to FIG. 19, the word lines 112 and the space left after forming the selection lines 113 are filled with an insulating layer 114. That is, the spaces corresponding to the first and second slits are filled with the insulating layer 114. The insulating layer 114 may be formed of an oxide layer.

After the channel insulating layer 110 at an upper end of the channel CH is removed, conductive layers 115A and 115B are formed in areas in which the channel insulating layer 110 has been removed. The conductive layer 115A is a drain region, and the conductive layer 115B is a source region.

Figure 20:
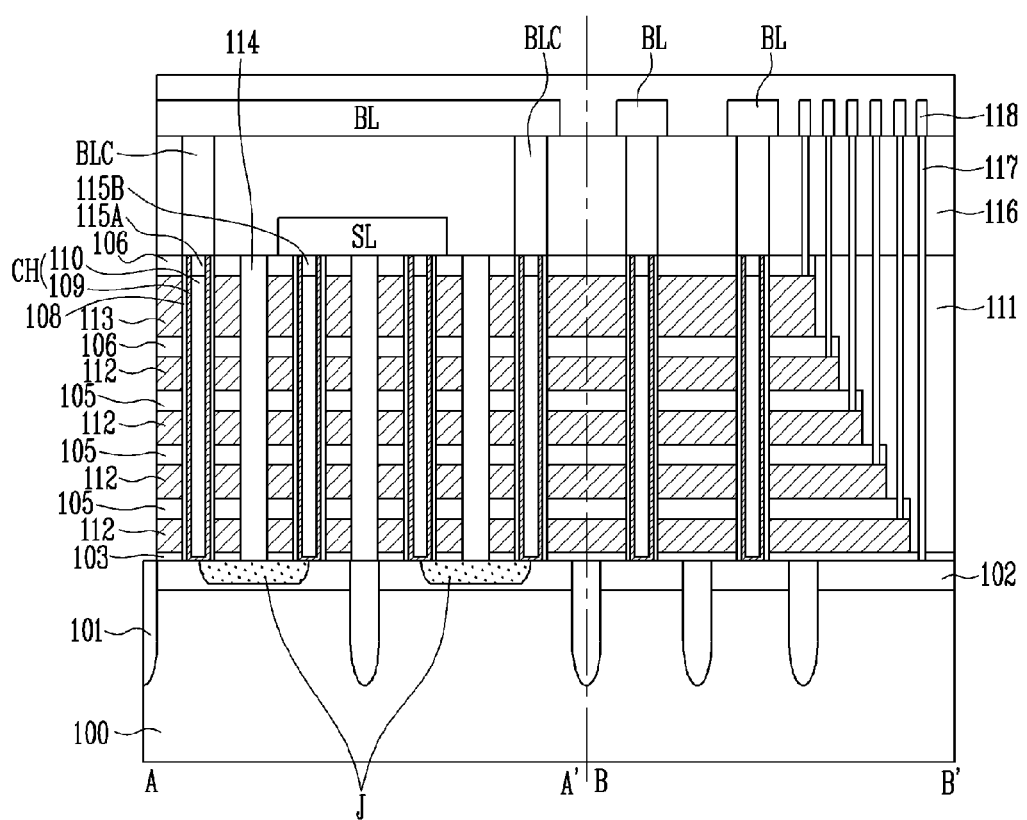

Referring to FIG. 20, a conductive material is deposited on the results of FIG. 9 and patterned to form a source line SL in contact with adjacent channels CH that belong to different pairs and extending in the second direction. A metal or metal silicide may be used as the conductive material to reduce the resistance of the source line SL.

A fourth interlayer insulating layer 116 covering the source line SL is then formed. A bit line contact (BLC) penetrating the fourth interlayer insulating layer 116 and in contact with the channel CH in which the drain region 115A is formed is formed. Also, a plurality of contacts 117 penetrating the fourth interlayer insulating layer 116 and the third interlayer insulating layer 111 to be connected to the selection line 113, the word line 112, and the conductive layer 102 for applying an erase voltage is formed.

A conductive material is deposited on the fourth interlayer insulating layer 116 and patterned, so that bit lines BL connected to the bit line contact BLC and extending in the first direction, and interconnections 118 connected to the plurality of contacts 26 are formed. The interconnections 118 may control an erase voltage applied to the selection lines 113, the word lines 112, and the conductive layer 102 for applying an erase voltage.

Consequently, the device of FIG. 11 may be fabricated. However, the method of fabricating the device illustrated in FIG. 1 is not limited thereto, and various modifications may be made. For example, instead of the first and second sacrificial layers 114 and 117, a method of directly depositing conductive layers for the word lines and selection lines may be employed.

According to a non-volatile memory device and method of fabricating the same of the present invention, integration intensity may be increased by vertically stacking memory cells, and an erase operation may be easily and efficiently performed.

In the drawings and specification, various embodiments of the invention have been disclosed, and although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A non-volatile memory device comprising:
   a semiconductor substrate having active regions formed of a p-type semiconductor;
   first and second vertical strings disposed on the active regions, and including channels vertical to the semiconductor substrate and a plurality of memory cells stacked along the channels, wherein the active regions are directly connected to the channels of the first and second vertical strings; and
   a plurality of ion implantation regions in the active regions, wherein the ion implantation regions connect the first and second vertical strings to the channels.

2. The device of claim 1, wherein the channels of the first and second vertical strings are formed at a boundary between the active regions and the ion implantation regions, so that they are directly connected to both the active regions and the ion implantation regions.

3. The device of claim 1, wherein the first and second vertical strings are electrically connected to each other by the ion implantation regions during program and reading operations.

4. A non-volatile memory device comprising:
   a conductive layer for applying an erase voltage formed on a semiconductor substrate;
   first and second vertical strings formed on the conductive layer for applying an erase voltage and including channels vertical to the semiconductor substrate, and a plurality of memory cells stacked along the channels, wherein the conductive layer for applying an erase voltage is directly connected to the channels of the first and second vertical strings; and
   a plurality of ion implantation regions in the conductive layers for applying an erase voltage, wherein the ion implantation regions connect the channels of first and second vertical strings.

5. The device of claim 4, wherein the channels of the first and second vertical strings are formed at a boundary between the conductive layers for applying an erase voltage and the ion implantation regions, so that they are directly connected to both the conductive layers for applying an erase voltage and the ion implantation regions.

6. The device of claim 4, wherein the channels of the first and second vertical strings are electrically connected to each other by the ion implantation regions during program and reading operations.

7. A method of operating a non-volatile memory device, the method comprising:
   providing a non-volatile memory device with having a semiconductor substrate with active regions formed of a p-type semiconductor, first and second vertical strings disposed on the active regions and including channels vertical to the semiconductor substrate and a plurality of memory cells stacked along the channels, and ion implantation regions formed in the active regions connecting the channels of the first and second vertical strings by the ion implantation regions during program and reading operations; and applying an erase voltage to the active regions during an erase operation by applying the erase voltage to the channels of the first and second vertical strings electrically connected to the active regions.

8. A method of operating a non-volatile memory device, the method comprising:

providing a non-volatile memory device with having conductive layers for applying an erase voltage formed on a semiconductor substrate, first and second vertical strings disposed on the semiconductor substrate and including channels vertical to the semiconductor substrate and a plurality of memory cells stacked along the channels, and ion implantation regions formed in the conductive layers for applying an erase voltage;

connecting the channels of the first and second vertical strings by the ion implantation regions during program and reading operations; and applying an erase voltage to the conductive layers for applying an erase voltage during an erase operation by applying an erase voltage to the channels of the first and second vertical strings electrically connected to the conductive layers for applying an erase voltage.

9. A method of fabricating a non-volatile memory device, comprising:

selectively etching a p-type semiconductor substrate and forming trenches defining a plurality of active regions;

forming an isolation layer filling the trenches;

forming first and second vertical strings disposed on the active regions; and forming ion implantation regions in the active regions, wherein the first and second vertical strings result in being disposed at a boundary between the ion implantation regions and the active regions by performing an ion implantation process.

10. The method of claim 9, wherein the first and second vertical strings include channels having lower ends in contact with the active regions and the ion implantation regions and vertical to the substrate, and a plurality of memory cells stacked along the channels.

11. The method of claim 9, further comprising forming a gate insulating layer on the active region and isolation layer before forming the first and second vertical strings, wherein the channels penetrate the gate insulating layer to be in contact with the active regions.

12. The method of claim 9, wherein the formation of the first and second vertical strings includes:

alternately stacking a plurality of sacrificial layers and a plurality of interlayer insulating layers on the active regions;

penetrating the plurality of sacrificial layers and the plurality of interlayer insulating layers to form first and second channel holes through which the active regions are exposed;

forming a memory layer and a channel layer on sidewalls of the first and second channel holes;

etching the plurality of sacrificial layers and the plurality of interlayer insulating layers between the first and second channel holes, and exposing the active regions between the first and second channel holes;

removing the sacrificial layers; and forming word lines filling space from which the sacrificial layers are removed with the conductive layer.

13. The method of claim 12, wherein the formation of the ion implantation regions in the active regions includes:

forming the ion implantation regions by performing the ion implantation process on the exposed active regions; and diffusing the ion implantation regions by performing an annealing process, wherein the ion implantation regions are diffused such that the ion implantation regions are in contact with the channel layers of the first and second vertical strings.

14. The method of claim 9, wherein the ion implantation regions are formed by implanting n-type impurities.

15. The method of claim 9, further comprising:

forming bit lines connected to upper ends of the channels of the first vertical strings after forming the ion implantation regions in the active regions; and forming source lines connected to upper ends of the channels of the second vertical strings.

16. A method of fabricating a non-volatile memory device, comprising:

forming conductive layers for applying an erase voltage on a semiconductor substrate;

selectively etching the conductive layers for applying an erase voltage and the semiconductor substrate, and forming a trench;

forming an isolation layer filling the trench;

forming first and second vertical strings disposed on the conductive layers for applying an erase voltage; and forming ion implantation regions in the conductive layer for applying an erase voltage, wherein the first and second vertical strings result in being disposed at a boundary between the ion implantation regions and the conductive layers for applying an erase voltage by performing an ion implantation process.

17. The method of claim 16, wherein the conductive layer for applying an erase voltage is formed of a p-type polysilicon layer.

18. The method of claim 16, wherein the first and second vertical strings include the conductive layers for applying an erase voltage, channels having lower ends in contact with and vertical to the substrate, and a plurality of memory cells stacked along the channels.

19. The device of claim 16, further comprising forming a gate insulating layer on the conductive layer for applying an erase voltage and isolation layer before forming the first and second vertical strings, wherein the channels penetrate the gate insulating layer to be in contact with the conductive layer for applying an erase voltage.

20. The method of claim 16, wherein the formation of the first and second vertical strings includes:

alternately stacking a plurality of sacrificial layers and a plurality of interlayer insulating layers on the conductive layer for applying an erase voltage;

penetrating the plurality of sacrificial layers and the plurality of interlayer insulating layers to form first and second channel holes through which the conductive layer for applying an erase voltage is exposed;

forming a memory layer and a channel layer on sidewalls of the first and second channel holes;

etching the plurality of sacrificial layers and a plurality of interlayer insulating layers between the first and second channel holes, and exposing the active regions between the first and second channel holes;

removing the sacrificial layers; and forming word lines filling space from which the sacrificial layers are removed with the conductive layer.

21. The method of claim 20, wherein the formation of the ion implantation regions in the conductive layer for applying an erase voltage includes:

forming the ion implantation regions by performing the ion implantation process on the exposed conductive layer for applying an erase voltage; and diffusing the ion implantation regions by performing an annealing process, wherein the ion implantation regions are diffused such that the ion implantation regions are in contact with the channel layers of the first and second vertical strings.

22. The method of claim 16, wherein the ion implantation regions are formed by implanting n-type impurities.

23. The method of claim 16, further comprising:

forming bit lines connected to upper parts of the channels of the first vertical strings after forming the ion implantation regions in the active regions; and forming source lines connected to the upper parts of the channels of the second vertical strings.

\* \* \* \* \*